United States Patent
Tu et al.

[11] Patent Number: 6,165,867
[45] Date of Patent: Dec. 26, 2000

[54] METHOD TO REDUCE ASPECT RATIO OF DRAM PERIPHERAL CONTACT

[75] Inventors: Yeur-Luen Tu, Taichung; Cheng-Yuan Hsu, Penghu; Cheng-Yuan Chang, Hsinchu, all of Taiwan

[73] Assignee: Taiwan Semiconductor Manufacturing Co., Ltd., Hsin-Chu, Taiwan

[21] Appl. No.: 09/246,919

[22] Filed: Feb. 9, 1999

[30] Foreign Application Priority Data

Sep. 30, 1998 [TW] Taiwan ................................. 87116217

[51] Int. Cl.$^7$ ..................................... H01L 21/20

[52] U.S. Cl. ..................... 438/399; 438/253; 438/306; 438/310; 438/620; 438/634; 438/672; 438/756; 438/618; 257/306

[58] Field of Search ..................................... 438/389, 620, 438/672, 634, 253, 399; 257/756, 306, 310

[56] References Cited

U.S. PATENT DOCUMENTS

| | | | |
|---|---|---|---|
| 5,414,655 | 5/1995 | Ozaki et al. | 365/149 |
| 5,804,479 | 9/1998 | Aoki et al. | 438/253 |
| 5,895,239 | 4/1999 | Jeng et al. | 438/239 |
| 5,918,120 | 6/1999 | Huang et al. | 438/239 |

*Primary Examiner*—Tom Thomas
*Assistant Examiner*—Nitin Parekh
*Attorney, Agent, or Firm*—Merchant & Gould P.C.

[57] ABSTRACT

The present invention provides a method for reducing aspect ratio of DRAM peripheral contact so as to achieving a good contact etching and metal deposition by utilizing conventional equipment. Besides, the present invention provides a stop layer formed by a nitride layer to reduce the volcano effect resulted from the misalignment between stacked contacts. Furthermore, the present invention is capable of etching poly layer and oxide layer in a single step, whereby the height of the peripheral contact is substantially the same as, or lower than, the contact of the storage node of a capacitor. Therefore, the aspect ratio of DRAM peripheral contact can be reduced.

19 Claims, 7 Drawing Sheets

METHOD TO REDUCE ASPECT RATIO OF DRAM PERIPHERAL CONTACT

FIELD OF THE INVENTION

The present invention generally relates to a manufacturing method of integrated circuit elements, and more particularly, to a method for reducing aspect ratio of DRAM (Dynamic Random Access Memory) peripheral contact.

REFERENCE TO PRIOR APPLICATION

This application has been filed in the R.O.C. (Taiwan) as Patent Application No. 87116217 on Sep. 30, 1998.

BACKGROUND OF THE INVENTION

As the sizes of DRAM elements are shrinking down, aspect ratio of peripheral contact of the DRAM elements will increase as the contact size reduces.

DRAM peripheral contact is usually formed after capacitor top plate (poly) patterning and capacitor planarization. A one-step contact etching is difficult considering the decrease in photoresist thickness due to the employment of Deep Ultra Violet (DUV). High aspect ratio contact generally results in difficulty in contact etching such as contact profile and also barrier metal deposition. A non-90 degree profile will result in extremely small size of bottom contact and extremely high contact resistance.

To overcome these drawbacks, stacked contact is a way to reduce contact aspect ratio. However, misalignment (13) between tungsten plugs (10 and 11) may result in volcano effect as shown in FIG. 1.

SUMMARY OF THE INVENTION

To overcome the aforementioned problems, it is an object of the present invention to provide a method for reducing aspect ratio of DRAM peripheral contact so as to achieving a good contact etching and metal deposition by utilizing conventional equipment It is further object of the present invention to provide a stop layer formed by a nitride layer to reduce the volcano effect resulted from the misalignment between stacked contacts.

It is another object of the present invention to provide a method for reducing aspect ratio of DRAM peripheral contact so as to simultaneously etch poly layer and oxide layer, whereby the height of the peripheral contact is substantially the same as, or lower than, the contact of the storage node of a capacitor. Therefore, the aspect ratio of DRAM peripheral contact can be reduced.

BRIEF DESCRIPTION OF THE DRAWINGS

For a more complete understanding of the present invention and the advantages thereof, reference is now made to the following descriptions taken in conjunction with the accompanying drawings which illustrate one or more embodiments of the present invention, wherein.

DETAILED DESCRIPTION OF THE PREFERRED EMBODIMENTS

Figure 2:
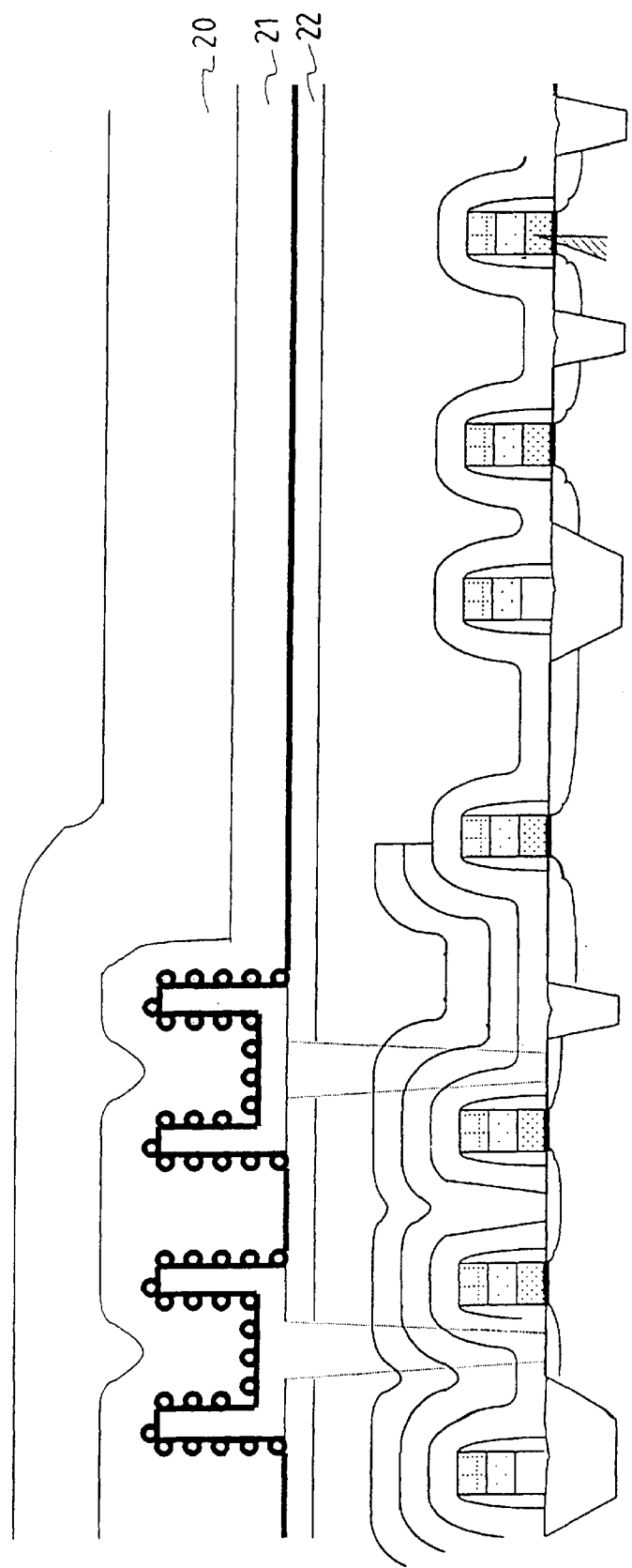
FIG. 2 illustrates a cross section view of a partially accomplished semiconductor substrate of the present invention.

Referring to FIG. 2, it illustrates a cross section view of a partially accomplished semiconductor substrate of the present invention. The present invention first forms a plurality of poly layers, capacitors and a SiN layer (22), such as source/drain regions, a first poly layer (P1), a first inter-poly dielectric layer (IPD1), a first contact layer (C1), a second poly layer (P2), a second inter-poly dielectric layer (IPD2), a second contact layer (C2) and a third poly layer (19), on a substrate to be formed a DRAM, wherein the thickness of the SiN layer (22) is in the range of 500~1500 Å. The present invention then etches a storage node in the DRAM cell, deposits an ONO (oxide-nitride-oxide) layer and deposits a fourth poly layer (21) on the above-mentioned partially accomplished substrate and deposits an oxide layer (20) on the fourth poly layer (21), the thickness of the fourth poly layer (21) is in the rage of 500~1500 Å depending on the peripheral contact height and oxide to poly etching selectivity and the height of the DRAM capacitor is in the range of 4000~7000 Å. The present invention then planarizes the oxide layer (20) to obtain a good DOF (Depth of Focus) for the following peripheral contact photo exposure.

Figure 3:
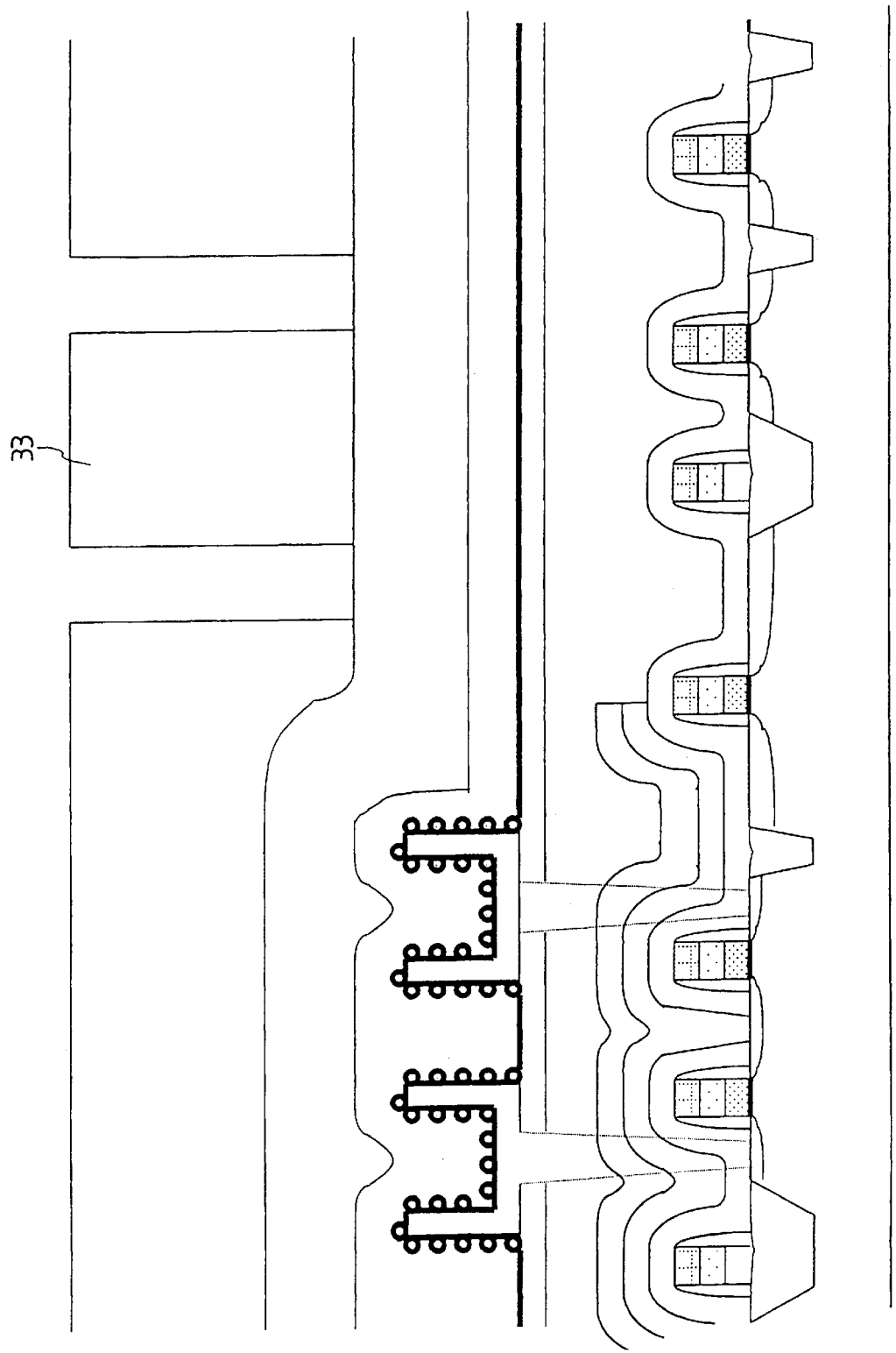
FIG. 3 illustrates a cross section view of the partially accomplished semiconductor substrate of FIG. 2 after developing a peripheral contact photoresist layer of the present invention.

Referring to FIG. 3, it illustrates a cross section view of the partially accomplished semiconductor substrate of FIG. 2 after developing a peripheral contact photoresist layer (33) of the present invention, wherein the photoresist layer (33) is developed on the predetermined locations of the oxide layer (20).

Figure 4:
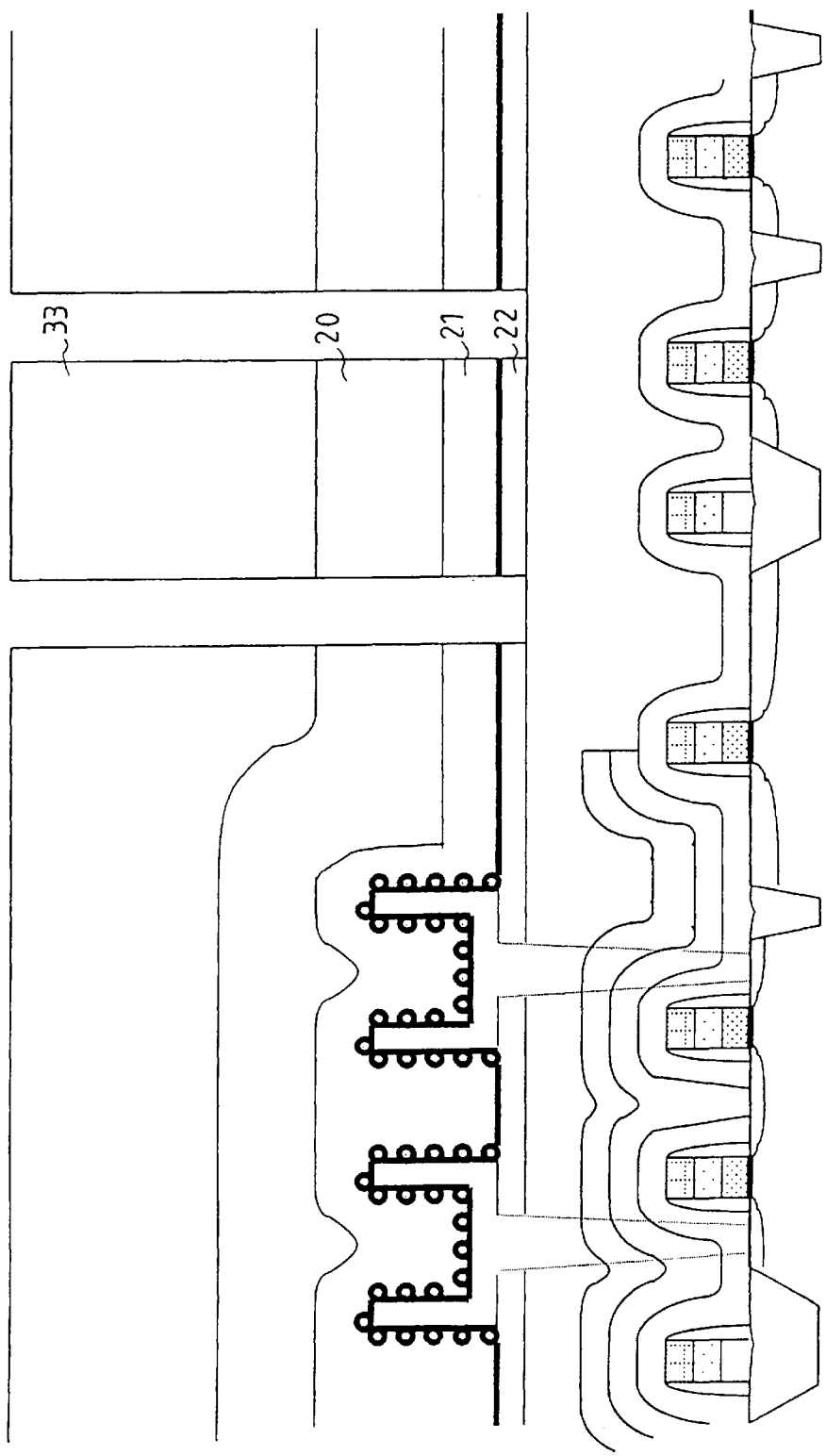
FIG. 4 illustrates a cross section view of the partially accomplished semiconductor substrate of FIG. 3 after applying one or a plurality of etching steps of the present invention.

Referring to FIG. 4, it illustrates a cross section view of the partially accomplished semiconductor substrate of FIG. 3 after applying one or a plurality of etching steps of the present invention, wherein the etching steps sequentially etch away the oxide layer (20), the fourth poly layer (21) and SiN layer (22) that are not protected by the photoresist layer (33).

Figure 5:
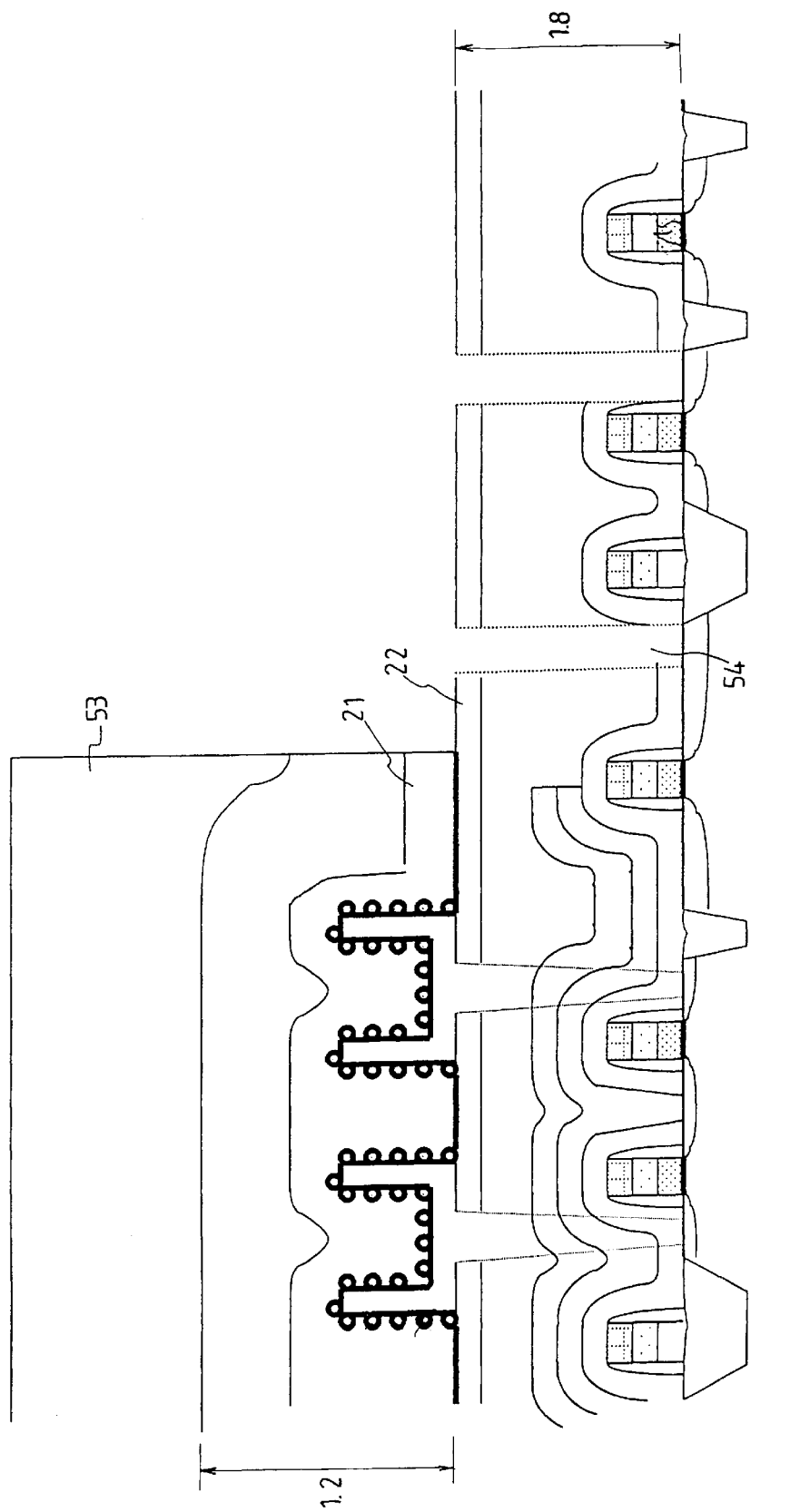
FIG. 5 illustrates a cross section view of the partially accomplished semiconductor substrate of FIG. 4 after removing photoresist, developing a photoresist layer on another capacitor and etching steps of the present invention.

Referring to FIG. 5, it illustrates a cross section view of the partially accomplished semiconductor substrate of FIG. 4 after removing the photoresist layer (33), developing a photoresist layer (53) on the predetermined locations of the oxide layer (20) and applying an oxide etching step to etch away the first inter-poly dielectric layer (IPD1) which is not protected by the oxide layer (20), poly layer (21) and nitride layer (22). The photoresist layer (53) is used to define capacitor top electrode. Holes (54) to be metalization are formed after the oxide etching step. Because the oxide layer (20) to poly layer (21) etching selectivity is in the range of 8:1~15:1 and the oxide layer (20) to SiN layer (22) etching selectivity is in the range of 5:1~25:1, the poly layer (21) and SiN layer (22) can be used as a hard mask or a stop layer due to their characteristics of etching selectivity. The function of these hard mask layer is to control contact size without the presence of photoresist. During the oxide etching step, the fourth poly layer (21) will be gradually removed away and the capacitor top electrode is formed. Therefore, the thickness of the fourth poly layer (21) can be controlled by adjusting the height of the oxide to be etched between the substrate and the SiN layer (22) and the oxide layer (20) to SiN layer (22) etching selectivity. After the above etching step, the height of the peripheral contact and that of the storage node of the capacitor of the DRAM are almost at the same topography level or even lower than that of the storage node of the capacitor of the DRAM.

Figure 1:
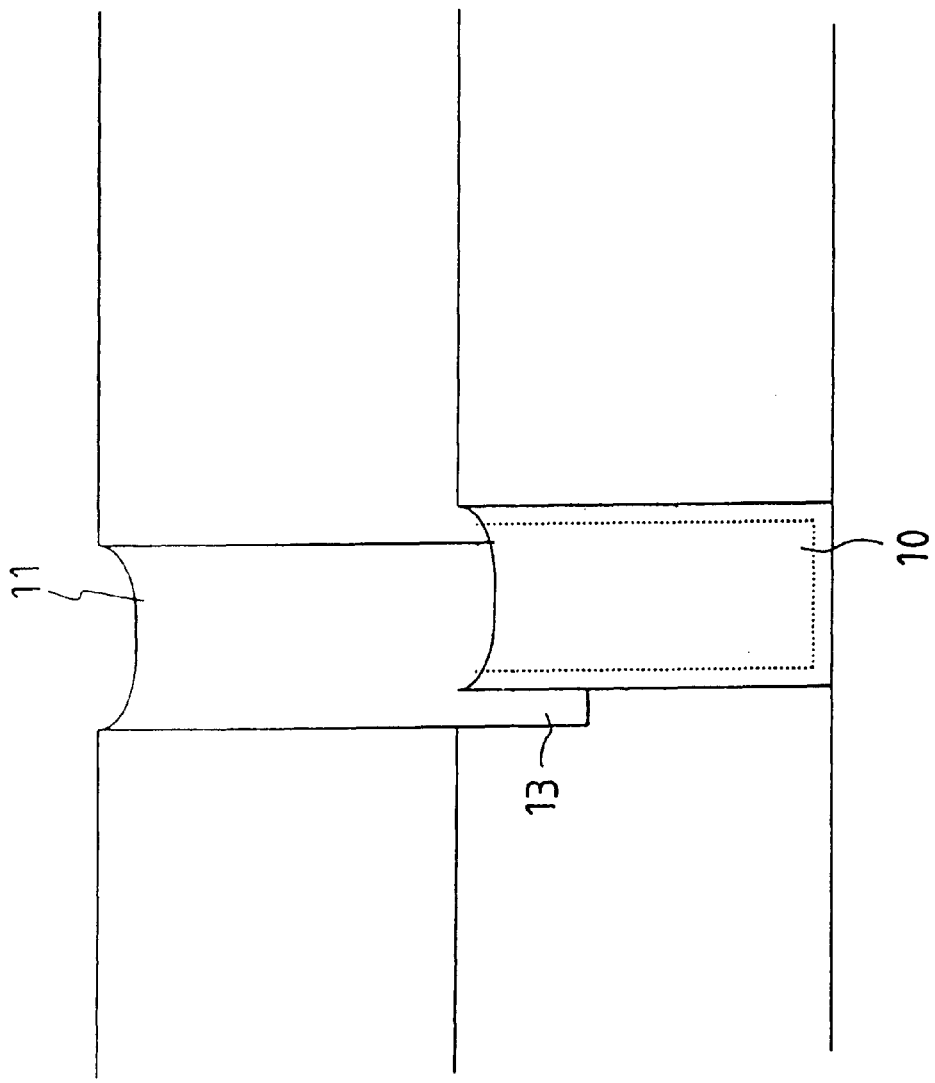
FIG. 1 illustrates the misalignment between the stacked tungsten plugs of the prior art.
Figure 6:
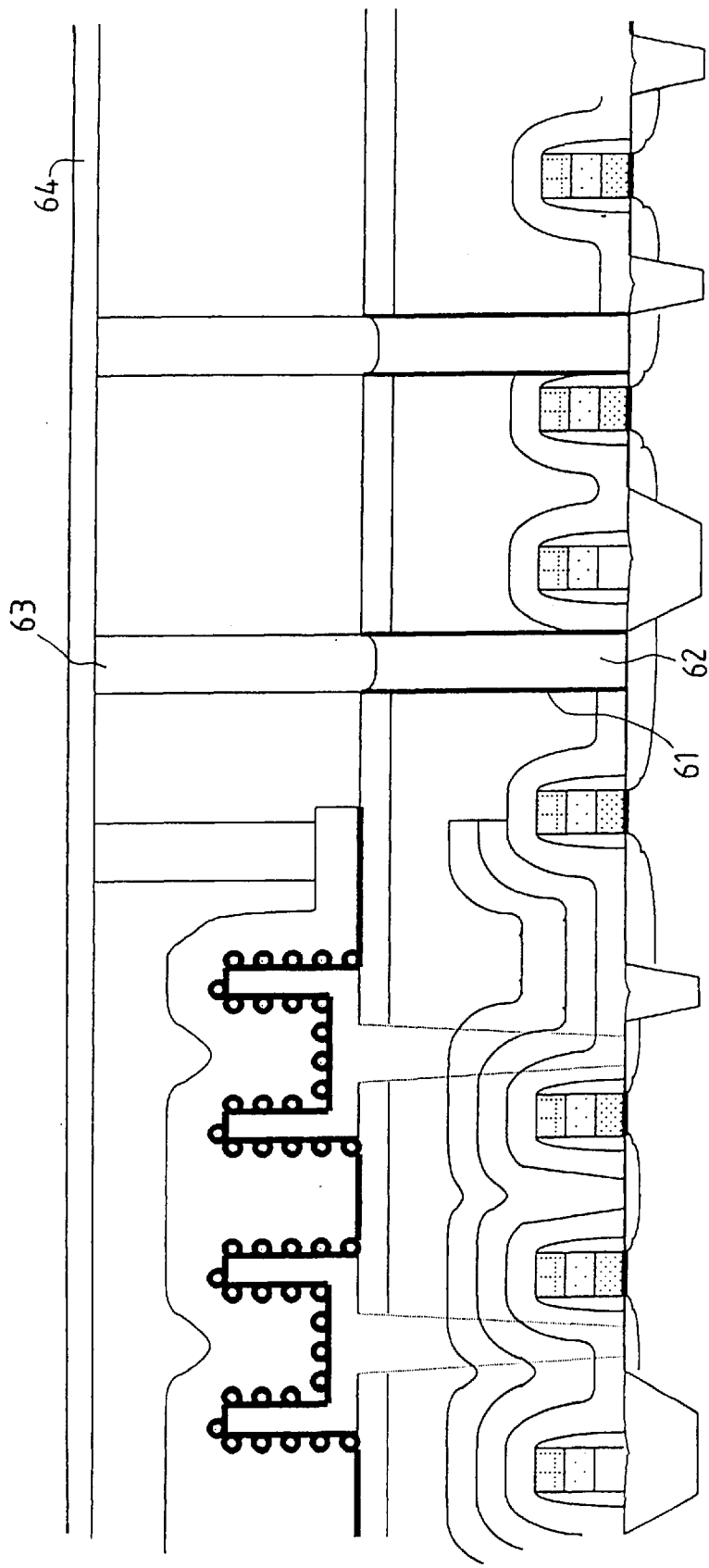
FIG. 6 illustrates a cross section view of the partially accomplished semiconductor substrate of FIG. 5 after stacking contacts of the present invention.

Referring to FIG. 6, it illustrates a cross section view of the partially accomplished semiconductor substrate of FIG. 5 after stacking contacts (metalization) of the present invention, wherein the metalizing step further comprises steps of depositing Ti/TiN (61) in the holes (54), depositing tungsten plug layer (62) and tungsten etching back. The present invention then further forms a planarized oxide layer (64) and another stacked contact (such as tungsten plug layer (63)) on the tungsten plug layer (62). The SiN layer (22) can be used as an etching stop layer, due to the oxide to nitride etching selectivity, to prevent from the downward etching when forming the tungsten plug layer (63). Therefore, the present invention is capable of preventing from the volcano effect as shown in FIG. 1 due to the misalignment between the stacked tungsten plugs.

Figure 7:
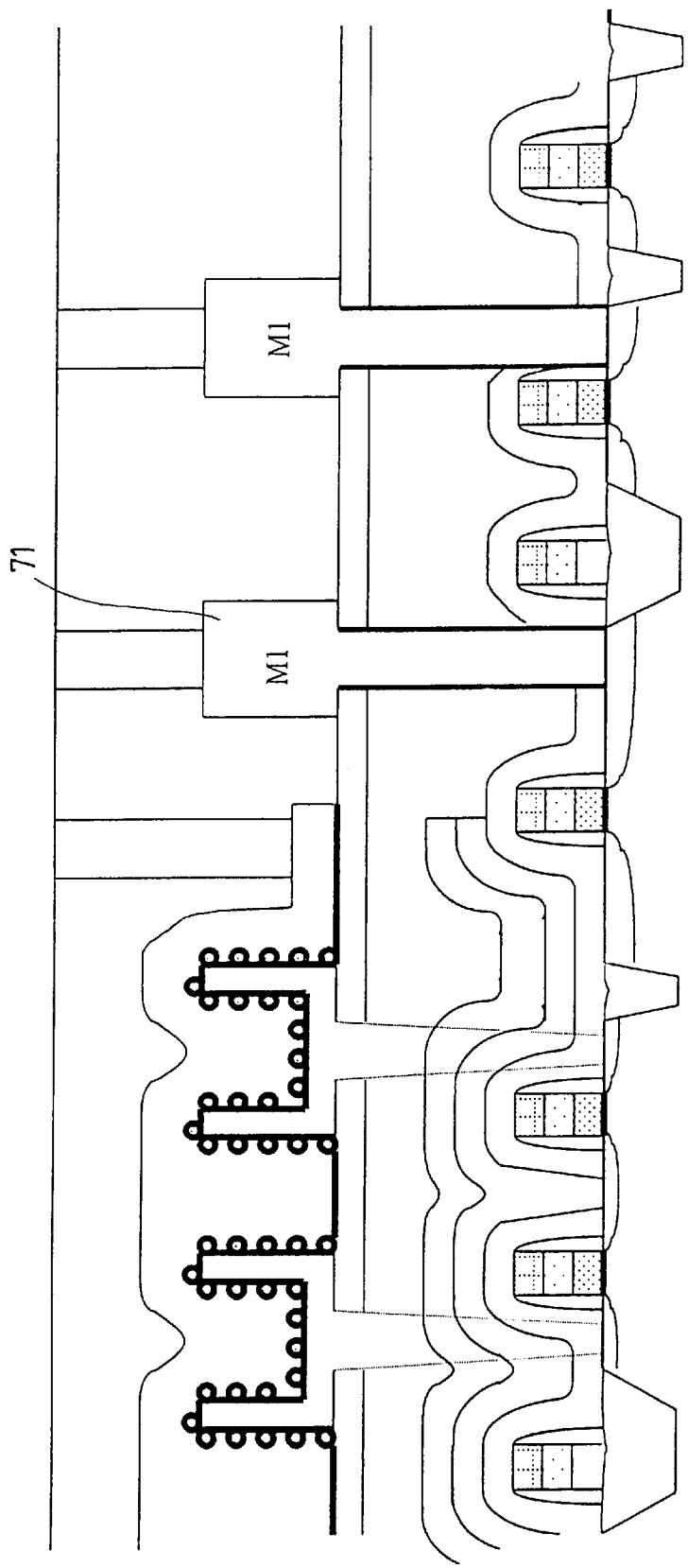
FIG. 7 illustrates a cross section view of the partially accomplished semiconductor substrate of FIG. 5 after stacking contacts and forming an intermediate metal layer of the present invention.

Referring to FIG. 7, it illustrates another embodiment of the present invention. This embodiment forms an intermediate metal layer (71) on the tungsten plug layer (62) before forming a stacked contact (tungsten plug layer (63)) so as to form a local interconnect layer of logic device of an embedded DRAM. Therefore, the present invention is capable of reducing the manufacturing steps of metal layer in the embedded DRAM manufacturing process.

In conclusion, the present invention provides a method for reducing aspect ratio of DRAM peripheral contact so as to achieving a good contact etching and metal deposition by utilizing conventional equipment. Besides, the present invention provides a stop layer formed by a nitride layer to reduce the volcano effect resulted from the misalignment between stacked contacts. Furthermore, the present invention is capable of etching poly layer and oxide layer in a single step, whereby the height of the peripheral contact is substantially the same as, or lower than, the contact of the storage node of a capacitor. Therefore, the aspect ratio of DRAM peripheral contact can be reduced.

Although the present invention and its advantage have been described in detail, it should be understood that various changes, substitutions and alternations can be made herein without departing from the spirit and scope of the invention as defined by the appended claims.

What is claimed is:

1. A method for reducing aspect ratio of DRAM peripheral contact, comprising the steps of:
   (a) forming a plurality of poly layers, a plurality of capacitors, a dielectric layer and a nitride layer on a semiconductor substrate;
   (b) depositing another poly layer on said semiconductor substrate;
   (c) depositing an oxide layer on said poly layer of step (b), wherein said oxide layer is planarized to form a planar surface;
   (d) developing a first photoresist layer on predetermined locations of said oxide layer of step (c);
   (e) etching away portions of said nitride layer formed in step (a), the poly layer deposited in step (b), and the oxide layer in step (c) not protected by said first photoresist layer of step (d);
   (f) removing said first photoresist layer;
   (g) developing a second photoresist layer on predetermined locations of said oxide layer of step (c);
   (h) forming a hole by etching away portions of said oxide layer in step (c) and said poly layer formed in step (b) which are not protected by said second photoresist layer of step (g), while etching away a portion of said dielectric layer in step (a);
   (i) forming a peripheral contact in the hole; and
   (j) forming a stacked contact on said peripheral contact of step (i).

2. The method as claimed in claim 1, wherein said etching step of step (e) further comprises steps of etching an oxide layer, a poly layer and a SiN layer.

3. The method as claimed in claim 1, wherein said metalizing step of step (i) further comprises a step of depositing Ti/TiN.

4. The method as claimed in claim 1, wherein said metalizing step of step (i) further comprises a step of depositing tungsten.

5. The method as claimed in claim 1, wherein said metalizing step of step (i) further comprises a step of tungsten etching back.

6. The method as claimed in claim 1, wherein the height of the peripheral contact formed in step (i) is substantially the same as the height of the contact of the storage node of one of said capacitors formed in step (a).

7. The method as claimed in claim 1, wherein the height of the peripheral contact formed in step (i) is lower than the height of the contact of the storage node of one of said capacitors formed in step (a).

8. The method as claimed in claim 1, wherein said step (j) further comprises a step of forming an intermediate metal layer.

9. The method as claimed in claim 8, wherein said intermediate metal layer is used as a local interconnect layer of logic device of an embedded DRAM.

10. The method as claimed in claim 1, wherein said nitride layer is used as a stop layer during the steps (h) and (j).

11. The method as claimed in claim 1, wherein the thickness of said poly layers formed in step (a) is in the range of 500~1500 Å.

12. The method as claimed in claim 1, wherein the thickness of said capacitors formed in step (a) is in the range of 4000~7000 Å.

13. The method as claimed in claim 1, wherein the thickness of said SiN nitride layer is in the range of 500~1500 Å.

14. The method as claimed in claim 2, wherein etching selectivity for said oxide layer to said poly layer is in the range of 8:1~15:1.

15. The method as claimed in claim 2, wherein etching selectivity for said oxide layer to said SiN layer is in the range of 5:1~25:1.

16. The method as claimed in claim 1, wherein step (c) further comprises a step of planarization.

17. The method as claimed in claim 1, wherein the number of said plurality of poly layers of step (a) is 3.

18. The method as claimed in claim 1, wherein said poly layer of step (b) is the fourth poly layer.

19. The method as claimed in claim 1, wherein said nitride layer of step (a) is a SiN layer.

* * * * *